United States Patent [19]
Moriyama et al.

[11] 3,891,469
[45] June 24, 1975

[54] METHOD OF MANUFACTURING SEMICONDUCTOR DEVICE

[75] Inventors: Hideki Moriyama; Seiichi Tachi, both of Tokyo, Japan

[73] Assignee: Hitachi, Ltd., Japan

[22] Filed: Oct. 4, 1973

[21] Appl. No.: 403,661

[30] Foreign Application Priority Data

Oct. 4, 1972 Japan .............................. 47-99008

[52] U.S. Cl. .................... 148/1.5; 148/187; 357/91
[51] Int. Cl. ............................................ H01l 7/54
[58] Field of Search ............. 148/1.5, 187; 317/235

[56] References Cited

UNITED STATES PATENTS

| | | | |
|---|---|---|---|
| 3,718,843 | 2/1973 | Kool | 317/235 |
| 3,737,702 | 6/1973 | Kool et al. | 317/235 |
| 3,748,187 | 7/1973 | Aubuchon et al. | 148/1.5 |
| 3,751,722 | 8/1973 | Richman | 317/235 |
| 3,755,001 | 8/1973 | Kool et al. | 148/1.5 |
| 3,755,014 | 8/1973 | Appels et al. | 148/1.5 X |

OTHER PUBLICATIONS

Maheux, "Transistor for Monolithic Circuits," IBM Tech. Discl. Bull., Vol. 11, No. 12, May, 69, pp. 1690, 1691.

*Primary Examiner*—L. Dewayne Rutledge
*Assistant Examiner*—J. M. Davis
*Attorney, Agent, or Firm*—Craig & Antonelli

[57] ABSTRACT

A method of manufacturing a semiconductor device in which the regions of elements formed within the same silicon substrate are insulatingly isolated from each other by a silicon dioxide region therebetween, characterized in that a diffused region having the same conductivity type as the first-mentioned region is formed prior to the formation of the silicon dioxide region, whereby an inversion layer due to the pile-up phenomen is prevented from being formed.

13 Claims, 10 Drawing Figures

METHOD OF MANUFACTURING SEMICONDUCTOR DEVICE

BACKGROUND OF THE INVENTION

1. Field of the Invention

The present invention relates to a method of manufacturing semiconductor devices. More particularly, it relates to a method of manufacturing a semiconductor device of the isoplanar structure in which the regions of elements formed within an identical silicon substrate are insulated and isolated therebetween by the use of silicon dioxide.

2. Description of the Prior Art

With the semiconductor device of this type, the surface of the substrate is comparatively flat, and the electrostatic coupling between the element regions can be made less than that in a prior-art semiconductor device in which element regions are isolated therebetween by the use of a P-N junction. Moreover, the degree of integration can be increased. Therefore, the isoplanar structure has recently become of considerable interest.

Experiments have revealed, however, that the semiconductor device does not always provide good electrical insulation between the element regions. This is due to the fact that the impurity concentration of the silicon surface in contact with silicon dioxide ($SiO_2$) buried in the silicon substrate, in order to insulate and isolate the elements, increases due to the pile-up phenomenon, leading to the formation of an inversion layer.

For example, where P-type regions each constituting a part of an element area are formed in an N-type silicon substrate and where a silicon dioxide region is buried between the P-type regions of two element areas, N-type impurity atoms in the N-type silicon substrate part, corresponding to the silicon dioxide region, are forced out by the aforesaid pile-up phenomenon to the parts of the P-type regions in contact with the silicon dioxide region, to bring into the N-type the P-type region parts held in contact with the silicon dioxide region. For this reason, N-type inversion layers are formed along the P-type regions held in contact with the silicon dioxide region. Since, in the isoplanar structure, the thickness of the silicon dioxide region is made especially large, the influence of the inversion to the N-type is very great.

Accordingly, even when the elements are insulatingly isolated from each other by the use of silicon dioxide, they are unpreferably short-circuited by the N-type inversion layers at some potentials of the respective element areas.

SUMMARY OF THE INVENTION

It is, therefore, a principal object of the present invention to provide an improved method of manufacturing a semiconductor device in which the insulating isolation between the regions of elements is made by the use of silicon dioxide.

Another object of the present invention is to provide a method of manufacturing a semiconductor device which can perfectly effect isolation between elements.

In order to accomplish such objects, the present invention is constructed such that, prior to forming a silicon dioxide region in a silicon substrate, a diffused region, of the same conductivity type as that of the regions which constitute parts of elements, is previously formed in the vicinity of the silicon dioxide region.

DESCRIPTION OF THE PREFERRED EMBODIMENTS

Figure 1A:
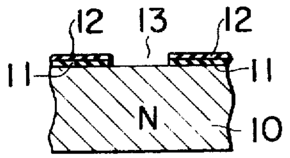
FIGS. 1*a* to 1*e* and FIGS. 2*a* to 2*e* are process diagrams respectively showing embodiments of the method of manufacturing a semiconductor device according to the present invention.
Figure 1B:
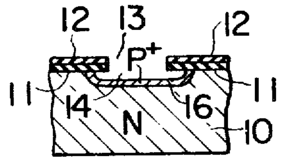

FIGS. 1*a* to 1*e* illustrate an embodiment of the method of manufacturing a semiconductor device according to the present invention. First, as shown in FIG. 1*a*, a silicon nitride film (hereinbelow termed "$Si_3N_4$ film") 11 and a silicon oxide film (hereinafter termed "$SiO_2$ film") 12 are formed on the surface of an N-type silicon substrate 10 in conformity with a predetermined pattern. Using an opening 13 through the $Si_3N_4$ film 11 and the $SiO_2$ film 12, the silicon substrate 10 is etched by any suitable well known etchant, such as hydrofluoric acid, to form a concave portion 14 as shown in FIG. 1*b*.

In this case, the concave portion 14 is so formed as to include, not only that part of the silicon substrate 10 which corresponds to the opening 13 of the $Si_3N_4$ film 11 and the $SiO_2$ film 12, but also a part under the $Si_3N_4$ film 11.

Subsequently, boron as a P-type impurity is diffused into the surface of the silicon substrate part defining the concave portion 14, to form a P-type diffused region 16 (refer to FIG. 1*b*).

Figure 1C:
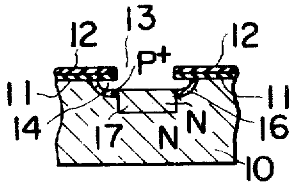

At the next step, using the $Si_3N_4$ film 11 as a mask, an N-type region 17 is formed by the ion implantation process at a part which underlies the bottom of the concave portion 14 of the silicon substrate 10 and which corresponds to the opening 13 (refer to FIG. 1*c*). The reason why the ion implanation is employed here for the formation of the N-type region 17, is to confine the N-type region 17 to a part narrower than the P-type diffused region 16. The N-type region 17 at this step is formed to be deeper than the P-type diffused region 16.

Subsequently, the resultant silicon substrate is brought into an oxidizing atmosphere and is heated, so that the exposed part of the substrate is subjected to thermal oxidation with the $Si_3N_4$ film made as a mask. Thus, an $SiO_2$ region 18 is formed in the concave portion 14 (refer to FIG. 1*d*).

Since, at this time, the silicon increases in volume through its oxidation, the surface of the $SiO_2$ region 18 formed in the concave portion 14 reaches substantially the same level as the surface of the silicon substrate 10. Namely, the silicon at the surface portion of the substrate, exposed to the oxygen, combines with the oxygen to form silicon oxide, which results in the formation of the silicon oxide film, due to the chemical reaction. This silicon oxide film has a larger volume than the amount of silicon which is consumed in the chemical reaction.

Thereafter, the $Si_3N_4$ film 11 and the $SiO_2$ film 12 are removed, whereupon P-type diffused regions 20 and 21 constituting parts of elements areas are formed (refer to FIG. 13). Further, impurities are selectively introduced, to form desired regions of the elements. Next, electrodes are provided by the use of known techniques. The part other than the electrodes is covered with an oxide film. Then, the semiconductor device is completed.

With such method of manufacture, since the P-type diffused region 16 is formed between the $SiO_2$ region 18 and the P-type diffused regions 20, 21 beforehand, the P-type impurity concentration at this part is extremely high. Therefore, the N-type inversion layer due to the pile-up phenomenon as in the prior art is not formed.

Figure 2A:
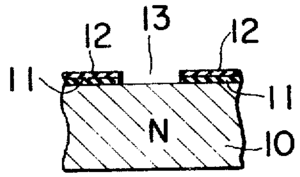

FIGS. 2*a* to 2*e* illustrate another embodiment of the method of manufacturing a semiconductor device according to the present invention. In the embodiment, an $SiO_2$ region is formed without providing the concave portion 14 as in the foregoing embodiment. First, as shown in FIG. 2*a*, an $Si_3N_4$ film 11 and an $SiO_2$ film 12 are formed on the surface of an N-type silicon substrate 10 in conformity with a predetermined pattern.

Figure 2B:
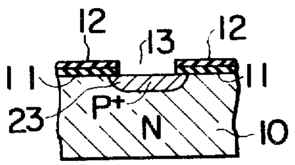

Boron is diffused into the silicon substrate 10 through an opening 13 of the $Si_3N_4$ film 11 and the $SiO_2$ film 12, to form a P-type diffused region 23 (refer to FIG. 2*b*). In this case, the P-type diffused region 23 extends under the $Si_3N_4$ film 11.

Figure 2C:
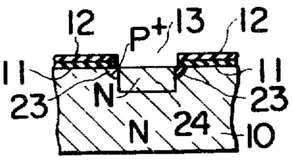
Figure 1D:
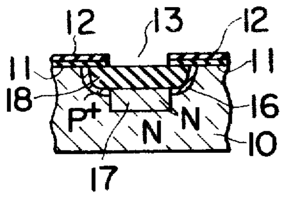

Subsequently, using the opening 13 again, an N-type region 24 is formed at the central part of the P-type diffused region 23 by the ion implantation process (refer to FIG. 2*c*). The N-type region 24 is formed to be deeper than the P-type diffused region 23.

Figure 2D:
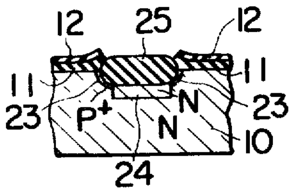
Figure 1E:
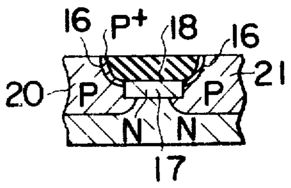

Next, an $SiO_2$ region 25 is formed by oxidation at those parts of the P-type diffused region 23 and the N-type region 24 which are close to the opening 13 (refer to FIG. 2*d*).

Figure 2E:
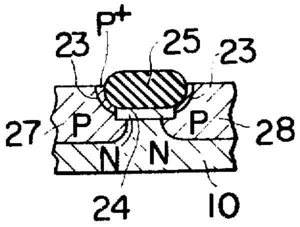

Then, after removing the $Si_3N_4$film 11 and the $SiO_2$ film 12, P-type diffused regions 27 and 28 constituting parts of element areas are formed (refer to FIG. 2*e*).

Also, with such a method, since the P-type diffused region 23 is formed between the $SiO_2$ region 25 and the P-type diffused regions 27, 28 beforehand, the P-type impurity concentration at this part is extremely high, and hence, the N-type inversion layer, due to the pile-up phenomenon as in the prior art, is not formed.

Although, in the foregoing embodiments, an N-type silicon substrate is used, a P-type silicon substrate may also be employed. In this case, the diffused region 16 or 23 is formed of an N-type impurity (for example, phosphorus).

Although, in the foregoing embodiments, the $Si_3N_4$ film 11 is formed on the surface of the silicon substrate in order to form the $SiO_2$ region 18 or 25, it is a matter of course that any other oxidation-resisting film such as one of alumina ($Al_2O_3$) may be employed.

As described above, the method of manufacturing a semiconductor device according to the present invention can perfectly effect insulating isolation between the regions of elements in a semiconductor device in which the isolation of the elements is effected by the use of silicon dioxide. It is, accordingly, very effective when applied to a complementary MIS semiconductor device or an isoplanar semiconductor device.

While we have shown and described several embodiments in accordance with the present invention, it is understood that the same is not limited thereto but is susceptible of numerous changes and modifications as known to a person skilled in the art, and We therefore do not wish to be limited to the details shown and described herein but intend to cover all such changes and modificataions as are obvious to one of ordinary skill in the art.

What we claim is:

1. A method of manufacturing a semiconductor device, comprising:

a. forming an oxidation-resisting film on a silicon substrate of a first conductivity type in conformity with a predetermined pattern;

b. diffusing an impurity of a second conductivity type opposite to that of said silicon substrate through an opening in said oxidation-resisting film, to form a first region;

c. implanting impurity ions of said first conductivity type through said opening to form a second region having a depth deeper than and a width narrower than said first region; and d. oxidizing the resultant silicon substrate by employing said oxidation-resisting film as a mask, to form a silicon dioxide region in said silicon substrate in the vicinity of said opening.

2. A method of manufacturing a semiconductor device, comprising:

a. selectively forming an oxidation-resistant film on a surface portion of a semiconductor substrate of a first conductivity type, so that said film exposes said surface through at least one opening therethrough;

b. introducing a first impurity of a second conductivity type, opposite said first conductivity type, through said at least one opening in said film, into said substrate to form a first semiconductor region of said second conductivity type therein;

c. introducing a second impurity of said first conductivity type through a selected surface portion of said first semiconductor region and into the substrate therebeneath to form a second semiconductor region having a depth deeper than and a width narrower than said first semiconductor region; and d. oxidizing the resultant substrate, using said film as a mask, thereby forming an oxide region on the surface of said first semiconductor region within the confines of said at least one opening.

3. A method according to claim 2, wherein said substrate is silicon and said oxide region is silicon oxide.

4. A method according to claim 2, wherein said oxidation resistant film includes a first layer of material selected from the group consisting of $Si_3N_4$ and $Al_2O_3$ formed directly on the surface of said substrate.

5. A method according to claim 4, wherein said film further includes a second layer of silicon dioxide formed atop said first layer.

6. A method according to claim 2, wherein the surface portion of said substrate includes a substantially concave portion bounded by a substantially planar portion, with said film formed to partially overhang the edge of said planar portion with said concave portion.

7. A method according to claim 2, further including the steps:

e. removing said oxidation-resistant film; and f. selectively introducing a third impurity of said second conductivity type into that surface portion of the substrate originally covered by said oxidation resistant film.

8. A method according to claim 6, wherein said step (d) comprises the step of oxidizing said resultant substrate until said oxide region substantially fills said concave portion.

9. A method according to claim 2, wherein said step (b) includes introducing said first impurity into said substrate beneath a portion of said oxidation resistant film and said step (c) includes introducing said second impurity into said substrate into said that portion of said first semiconductor region the area of which is defined substantially by the area of said at least one opening in said oxidation-resistant film.

10. A method according to claim 9, wherein step (b) comprises diffusing said first impurity into said substrate and said step (c) comprises ion implanting said second impurity through said at least one opening in said oxidation-resistant film.

11. A method according to claim 6, wherein said step (b) includes introducing said first impurity into said substrate beneath a portion of said oxidation resistant film and said step (c) includes introducing said second impurity into said substrate into said that portion of said first semiconductor region the area of which is defined substantially by the area of said at least one opening in said oxidation-resistant film.

12. A method according to claim 11, wherein step (b) comprises diffusing said first impurity into said substrate and said step (c) comprises ion implanting said second impurity through said at least one opening in said oxidation-resistant film.

13. A method according to claim 11, wherein said step (d) comprises the step of oxidizing said resultant substrate until said oxide region substantially fills said concave portion.

* * * * *